(12) United States Patent
Sykora et al.

(10) Patent No.: US 8,988,062 B2
(45) Date of Patent: *Mar. 24, 2015

(54) BRANCH CIRCUIT MONITOR

(71) Applicant: Precision Air & Energy Services, LLC, Denver, CO (US)

(72) Inventors: Montgomery J. Sykora, Denver, CO (US); Daniel L. Janovy, Spearfish, SD (US); David L. Janovy, Sturgis, SD (US)

(73) Assignee: Precision Air & Energy Services, LLC, Denver, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/108,134

(22) Filed: Dec. 16, 2013

(65) Prior Publication Data
US 2014/0368190 A1 Dec. 18, 2014

Related U.S. Application Data

(63) Continuation of application No. 13/963,844, filed on Aug. 9, 2013, now Pat. No. 8,610,438.

(60) Provisional application No. 61/681,527, filed on Aug. 9, 2012, provisional application No. 61/681,406, filed on Aug. 9, 2012.

(51) Int. Cl.
*G01R 19/22* (2006.01)

(52) U.S. Cl.
CPC .................................. *G01R 19/22* (2013.01)
USPC ........ 324/119; 324/522; 324/76.15; 324/537; 324/750.14; 324/750.01; 361/679.01; 361/641; 361/622; 361/644; 361/727; 307/66; 307/64

(58) Field of Classification Search
CPC .... G01R 31/025; G01R 31/08; G01R 31/088; G01R 31/085; G01R 31/0285; G01R 31/024; G01R 31/2812; G01R 31/2884; G01R 31/2853; G01R 31/31924; G01R 31/31922; G01R 11/04; H02B 1/50; H02B 1/056; H02B 1/04; H02B 1/00; H02B 1/044; H01R 13/70; H01R 13/6658; H01R 25/003; H01R 25/006
USPC ................. 324/119, 522, 76.15, 537, 750.14, 324/750.01, 111; 361/679.01, 641, 622, 361/644, 727; 307/66, 64, 601; 323/282

See application file for complete search history.

(56) References Cited

U.S. PATENT DOCUMENTS 5,181,026 A   1/1993 Granville
5,861,683 A * 1/1999 Engel et al. ..................... 307/38

(Continued)

*Primary Examiner* — Huy Q Phan
*Assistant Examiner* — Thang Le
(74) *Attorney, Agent, or Firm* — Dinsmore & Shohl LLP

(57) ABSTRACT

A branch circuit monitoring system (BCMS) for monitoring branch circuit currents in one or more electrical circuit panels is described. The system is comprised of a data center server, one or more panel processors, each with one or more collection devices, and one or more current sensors per collection device. The BCMS is designed to be installed entirely inside the panel without the need for a dedicated enclosure or power supply to facilitate ease of installation and low-cost. The BCMS also allows for future upgradability through standard software updates so that the system can be updated or patched easily. The BCMS data center server collects, aggregates, stores, and serves historical branch circuit current data from the panel processors to networked users via a web server to provide visualization of data such as tables, charts, and gauges. Finally, the BCMS interfaces to third-party software suites using industry-standard protocols such as Modbus® TCP and BACnet™ for integration with data center infrastructure management or building management system software.

22 Claims, 10 Drawing Sheets

(56) References Cited

U.S. PATENT DOCUMENTS

| | | |
|---|---|---|
| 6,330,516 B1 | 12/2001 | Kammeter |
| 7,230,414 B2 | 6/2007 | Bruno |
| 7,453,267 B2 | 11/2008 | Westbrock, Jr. et al. |
| 8,026,152 B2 * | 9/2011 | Yamazaki et al. ............ 438/458 |
| 8,421,443 B2 | 4/2013 | Bitsch et al. |
| 8,421,639 B2 | 4/2013 | Bitsch et al. |
| 8,519,843 B2 * | 8/2013 | El-Essawy et al. ........... 340/538 |
| 8,554,388 B2 * | 10/2013 | Kibbie .......................... 700/298 |
| 2005/0180069 A1 | 8/2005 | Tchernobrivets |
| 2005/0212526 A1 | 9/2005 | Blades |
| 2007/0146944 A1 | 6/2007 | Zhang et al. |
| 2010/0145641 A1 | 6/2010 | Bose et al. |
| 2010/0176960 A1 | 7/2010 | Bitsch et al. |
| 2010/0235122 A1 | 9/2010 | McCrea et al. |
| 2010/0308792 A1 | 12/2010 | Rupert et al. |
| 2011/0291488 A1 | 12/2011 | Paik et al. |
| 2012/0049879 A1 * | 3/2012 | Crites ...................... 324/761.01 |
| 2012/0050937 A1 * | 3/2012 | Saito et al. ..................... 361/187 |
| 2012/0089356 A1 * | 4/2012 | Taft ................................. 702/64 |
| 2012/0278562 A1 | 11/2012 | Cook et al. |
| 2012/0327563 A1 | 12/2012 | Cook |
| 2013/0271895 A1 * | 10/2013 | Kuhns .......................... 361/622 |

* cited by examiner

BRANCH CIRCUIT MONITOR

CROSS-REFERENCE TO RELATED APPLICATIONS

This application is a continuation of U.S. patent application Ser. No. 13/963,844 entitled "Branch Circuit Monitor" filed by Montgomery J. Sykora et al. on Aug. 9, 2013, which is hereby incorporated by reference as though fully set forth herein.

This application also claims the benefit, through the Ser. No. 13/963,844 application, of U.S. provisional application No. 61/681,406 entitled "Apparatus, System and Method for Branch Circuit Monitoring" filed by Montgomery J. Sykora et al. on Aug. 9, 2012 and U.S. provisional application No. 61/681,527 entitled "Apparatus, System and Method for Branch Circuit and HVAC Monitoring and Control for Optimal Cooling and Energy Efficiency" also filed by Montgomery J. Sykora et al. on Aug. 9, 2012, both provisional applications are also hereby incorporated by reference as though fully set forth herein.

BACKGROUND

1. Field

Aspects of the present disclosure involve a branch circuit monitoring system providing information concerning the utilization of individual branch circuits, particularly within a data center, and providing the ability to manage those circuits so that individual circuits are not overloaded while at the same time fully utilizing various circuits.

2. Background

Branch circuit monitoring (BCM) devices typically utilize a multitude of current transformers (CTs) connected to a sampling and processing board, either directly or via an intermediary circuit board. The CTs generate a voltage or current electric signal that is proportional to the current flowing in the branch circuit. The standard procedure dictates a sampling of the electric signal and performing mathematical calculations to determine the RMS current. Additional calculations such as real power, apparent power, power factor, and kWh are possible with the estimation or measurement of the voltage of the branch circuit. However, because the circuits are limited by the circuit breaker current rating, the most important and useful measurement is the RMS current value. This value is used to determine if a circuit is in danger of being overloaded, or can be summed with other current values to give a phase current total. Some BCM devices use digital signal processors and a multitude of analog-to-digital (A/D) converters to accomplish this. As the number of circuits monitored grows, the size and complexity of the collection and processing circuitry increases, leading to large systems and relatively high prices per panel. A typical data center may have hundreds of panels and thousands of circuits to monitor, making conventional BCM devices prohibitively expensive to install.

Typical BCM devices require that the circuit panel be de-energized to pass the circuit wires through the CTs, making retrofits difficult in data centers that need continuous operation (or up-time). Use of split-core CTs alleviates some of the difficulty of installing a BCM in a "live" panel, but in general, the main processing circuitry still has the disadvantage of being large and requiring a separate cabinet and power supply for installation. These two requirements increase the cost and complexity of the BCM device installation.

In addition, most prior art BCM devices are designed with application-specific processors and circuitry. This makes upgrading or improving the system difficult and expensive, if even possible.

BRIEF SUMMARY

In accordance with one embodiment a branch circuit monitoring (BCM) device comprises a programmable panel processor, a plurality of small, modular collection devices, and a plurality of non-contact current sensors.

Accordingly several disadvantages described above can be alleviated or mitigated by the apparatus, system and methods described herein along with additional desirable features.

An improved branch circuit monitoring device, system and methods are described herein. The device, system and methods overcome the major issues with current BCM devices and systems: high cost, installation complexity, and obsolescence. These factors are interrelated and are addressed by multiple approaches and methods. Together, the features and improvements presented make branch circuit current monitoring affordable and feasible for existing data centers.

The complexity of the BCM device is reduced while simultaneously decreasing the size and footprint of the apparatus to allow a low-cost system to be installed easily inside a standard panel board without external enclosures or a dedicated power supply. The use of accurate RMS-to-DC voltage converter circuitry on small, decentralized collection boards allows for relatively inexpensive general purpose processor to be utilized for the data aggregation and processing while maintaining highly accurate current values. Finally, standard networking protocols such as TCP, HTTP, UDP, as well as any specific protocols such as BACnet™, Modbus®, or SNMP are supported. The system supports long-term data storage, retrieval, and visualization using modern, open-source programs and methods and the ability to integrate numerous BCM devices into a system.

In one implementation, a branch circuit monitoring system is provided comprising: a first collection device configured to receive signals indicative of a measured current value in at least one branch circuit of a first plurality of branch circuits and convert the signals indicative of the measured current value in the at least one branch circuit of the first plurality of branch circuits from an alternating current (AC) signal to a direct current (DC) signal; a second collection device configured to receive signals indicative of a measured current value in at least one branch circuit of a second plurality of branch circuits and convert the signals indicative of the measured current value in the at least one branch circuit of the second plurality of branch circuits from an alternating current (AC) signal to a direct current (DC) signal; and a panel processor in communication with the first and second collection devices configured to receive the plurality of DC signals, the panel processor configured to store in a local memory a plurality of data structures comprising the measured branch circuit current data values for said branch circuit along with a timestamp associated with a time at which the currents were measured.

In another implementation, a method of monitoring branch circuits is provided comprising: receiving, at a first collection device, a first plurality of signals indicative of a first plurality of measured current values of a first plurality of branch circuits; converting, at the first collection device, the signals indicative of the measured current value of the first plurality of branch circuits from a first alternating current (AC) signal to a first direct current (DC) signal; receiving, at a second collection device, a second plurality of signals indicative of a second plurality of measured current values of a second plurality of branch circuits; converting, at the second collection device, the signals indicative of the measured current value of the second plurality of branch circuits from a second alternating current (AC) signal to a second direct current (DC) signal; receiving, at a panel processor in communication with the first and second collection devices, the first and second plurality of DC signals; and storing, in a local memory of the panel processor, a plurality of data structures comprising the measured branch circuit current data values for said branch circuit along with a timestamp associated with a time at which the currents were measured.

The foregoing and other aspects, features, details, utilities, and advantages of the present invention will be apparent from reading the following description and claims, and from reviewing the accompanying drawings.

DETAILED DESCRIPTION

Figure 1:
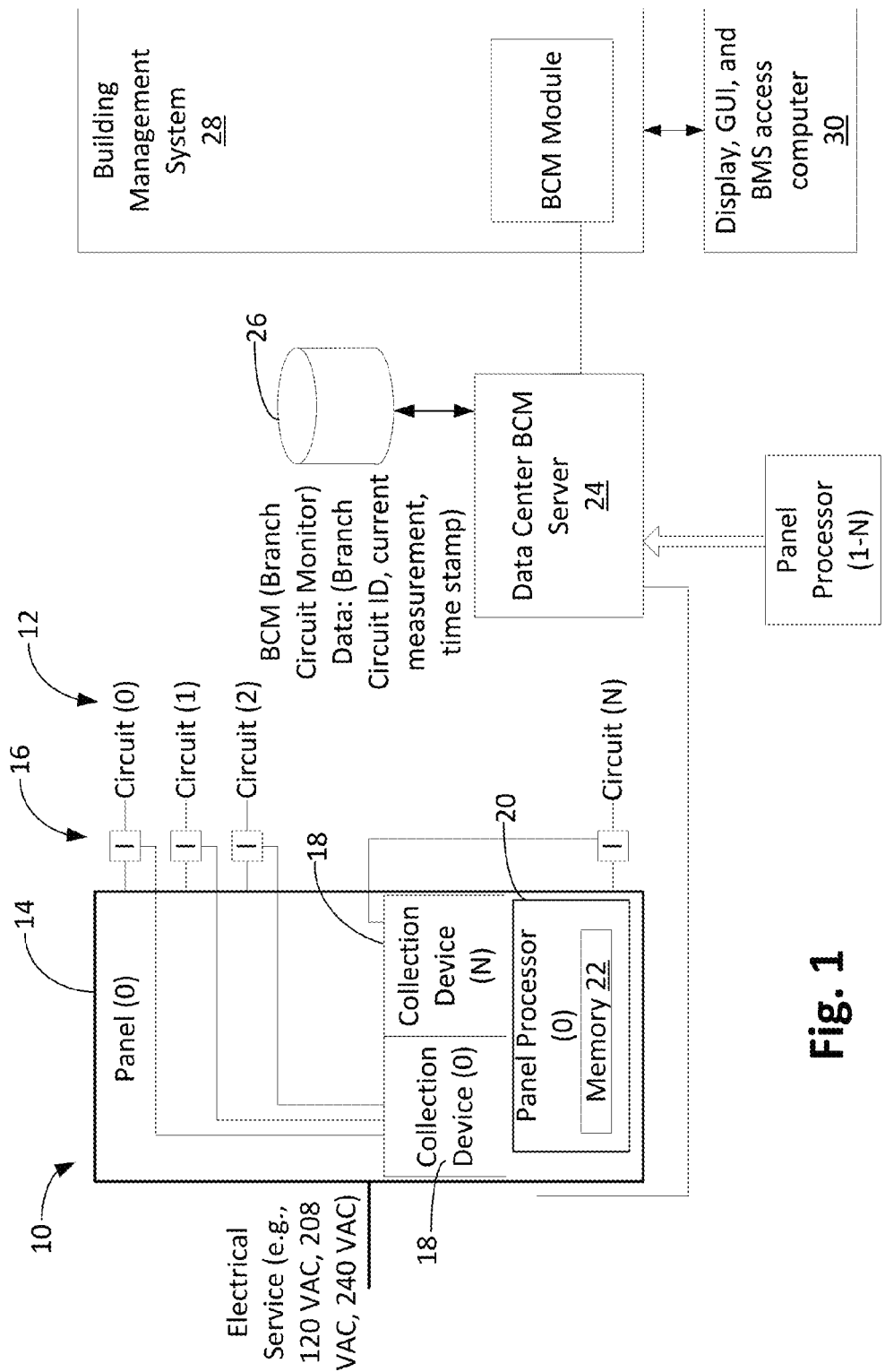
FIG. 1 shows an example implementation of a branch circuit monitoring system.

Modern data centers host a tremendous number of computing devices, such as web servers and the data storage systems necessary for enterprise software operations, cloud computing, Internet access and applications, and numerous other computing functions. The power for the physical equipment within the data center is supplied by branch circuits. So, for example, a rack of servers that are used to host a website may be supplied by a single 20 Amp rated branch circuit. These branch circuits, as illustrated in FIG. 1, originate from a power panel where the source of power is received, which may be a 120 volt, 208 volt or other alternating current (AC) supply, and which may be two or three phase. The power supplied to the panel is then distributed across some number of discrete branch circuits. Conventional panels may include 42 or 72 branch circuits with each circuit also including a breaker.

FIG. 1 shows one example implementation of a branch circuit monitoring device 10. A branch circuit monitor 10 is a device that enables the monitoring of individual branch circuits 12 of an electrical panel 14. A typical panel contains 42 or 72 branch circuits, although other panel configurations are possible. These circuits are then routed to equipment or equipment racks where individual computers, networking devices, or similar components draw power from one or more circuits. The monitoring of the branch circuit current values can be used, for example, to trigger alarms, both locally and remotely, as well as be archived in a database for retrieval and analysis.

In one example, the branch current monitor 10 is configured to measure and log the branch current of a plurality of branches spanning the power panels of the data center. One or more current sensors 16 are used to monitor the current of each branch circuit 12. In some cases, more than one current sensor 16 may be deployed across various sub-branches of a branch circuit 12. The sub-branch currents may later be summed, such as by a management board, to determine a total branch current.

In one implementation, each of the current sensors 16 (e.g., current transformers (CTs)) connects to a collection device 18 (e.g., a current measurement board or other collection device) located in the power panel 14. The current sensors 16 provide the collection device 18 with a signal indicative of the branch circuit current. The collection device 18 uses the signal from the current sensor 16 to produce a voltage (or other signal) indicative of the measured current that can be understood by a panel processor 20. The panel processor 20 receives each voltage signal (or other type of signal), calculates a current, and stores the current measurement along with a timestamp and address in a memory 22. This information may be later relayed to a server, such as the Data Center BCM Server 24 shown in FIG. 1, for longer term storage in a database, such as BCM Database 26 shown in FIG. 1. The server 24 may periodically report measurements to a building management system (BMS) 28 and/or to a user. Users may also alter the configuration of the branch current monitor 10 by accessing the server 24. A user interface 30, such as a display with a graphical user interface (GUI), may be used to report data or other information to a user.

Figure 2:
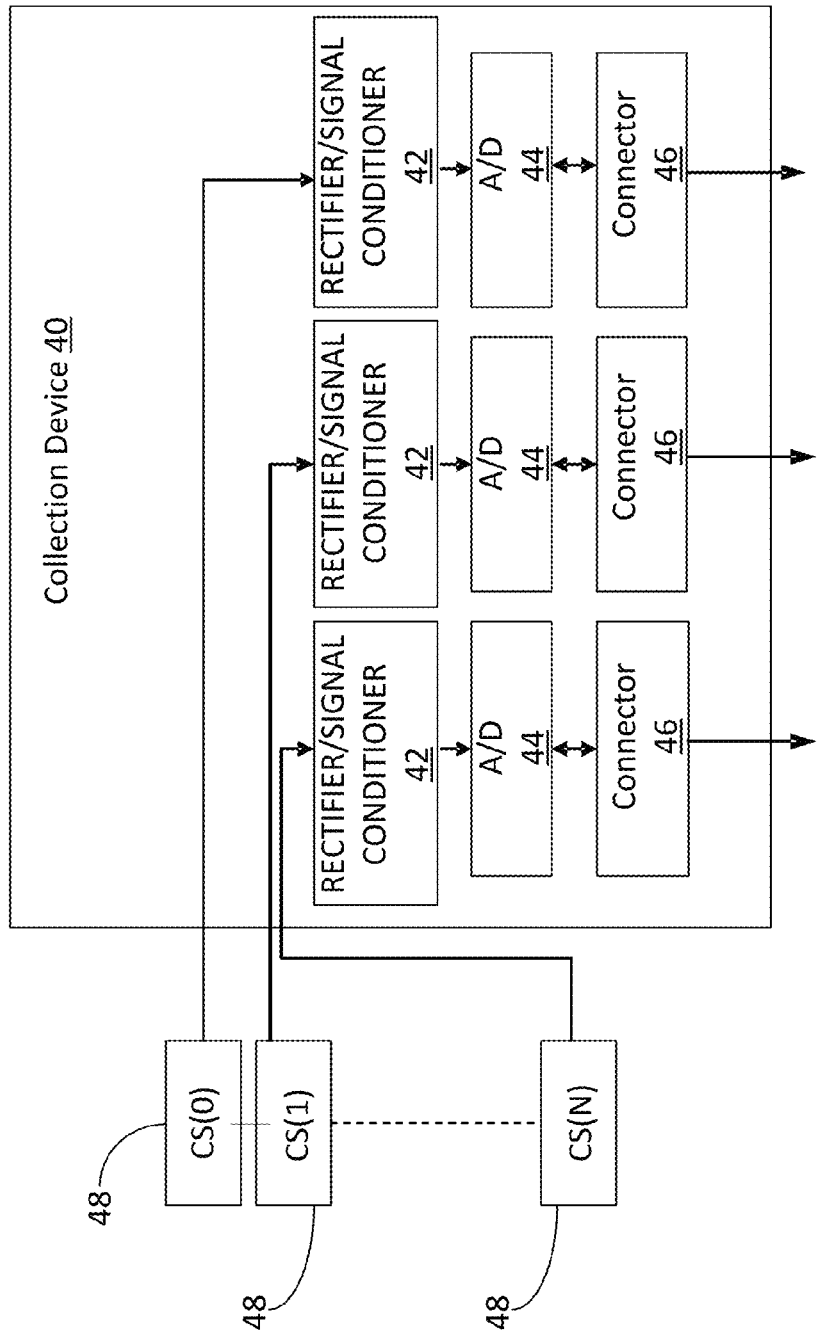
FIG. 2 shows an example implementation of a collection device that may be used within a branch circuit monitoring system such as shown in FIG. 1.

FIG. 2 shows an example implementation of a collection device 40 (in this implementation, a current measurement board although other collection devices are contemplated) that may be used within a branch circuit monitoring system, such as the branch circuit monitor 10 shown in FIG. 1. In this particular implementation, the collection device may utilize any method form measuring current and provide the current measurement to a panel processor 50 (shown in FIG. 3). As shown in FIG. 2, the collection device 40 may include a rectifier/signal conditioning element 42, an analog-to-digital (A/D) converter 44, and an output connection 46. Together these elements may be configured to convert the signal captured by the current sensor 48, such as a CT, into a signal that is usable by the panel processor 50. For example, the rectifier/signal conditioning element 42 may comprise a resistor coupled to a voltage rectifier to convert the AC resistor voltage to an equivalent direct current (DC) voltage. The resistor may be connected to the terminals of the current sensor 38 (e.g., CT). When branch circuit current is nonzero, a current will flow through the resistor creating a measurable voltage drop. If the branch circuit has an AC voltage, the resistor voltage will likewise be an AC voltage. In many cases, it may be beneficial to convert the AC resistor voltage to an equivalent DC voltage using the rectifier of the rectifier/signal conditioning element 42. This element may also comprise a signal conditioner configured to prepare the signal for use by the A/D converter 44. The signal may be amplified (or scaled down) to be in an operable range of the A/D converter 44 and may also be filtered to remove excess noise. For example, the A/D converter 44 may be configured to accept a DC input and the rectifier may only provide a 0 to 1V output. In this case, it may be beneficial to amplify the output of the rectifier in the signal conditioner 42 to produce an output signal. The rectified and conditioned signal is then communicated to the A/D converter 44 which then converts the signals from each current sensor 48 into digital values and produces an output for transmission to the panel processor 50. The A/D converter 44 interfaces with a connection element 46, such as a standard RJ45 connection or any other suitable electrical connection. In one example, the connection element 46 may also be configured to receive DC power from the panel processor 50.

In one specific implementation, each collection device is connected with or otherwise configured to receive an input from N current sensors 48 (e.g., 1 to 8 current sensors). Depending on the implementation, however, any number of current sensors may be connected with to a collection device. Likewise, each power panel may have a single collection device or a plurality of collection devices depending on the number of branch circuits and the implementation of the collection devices.

Figure 3:
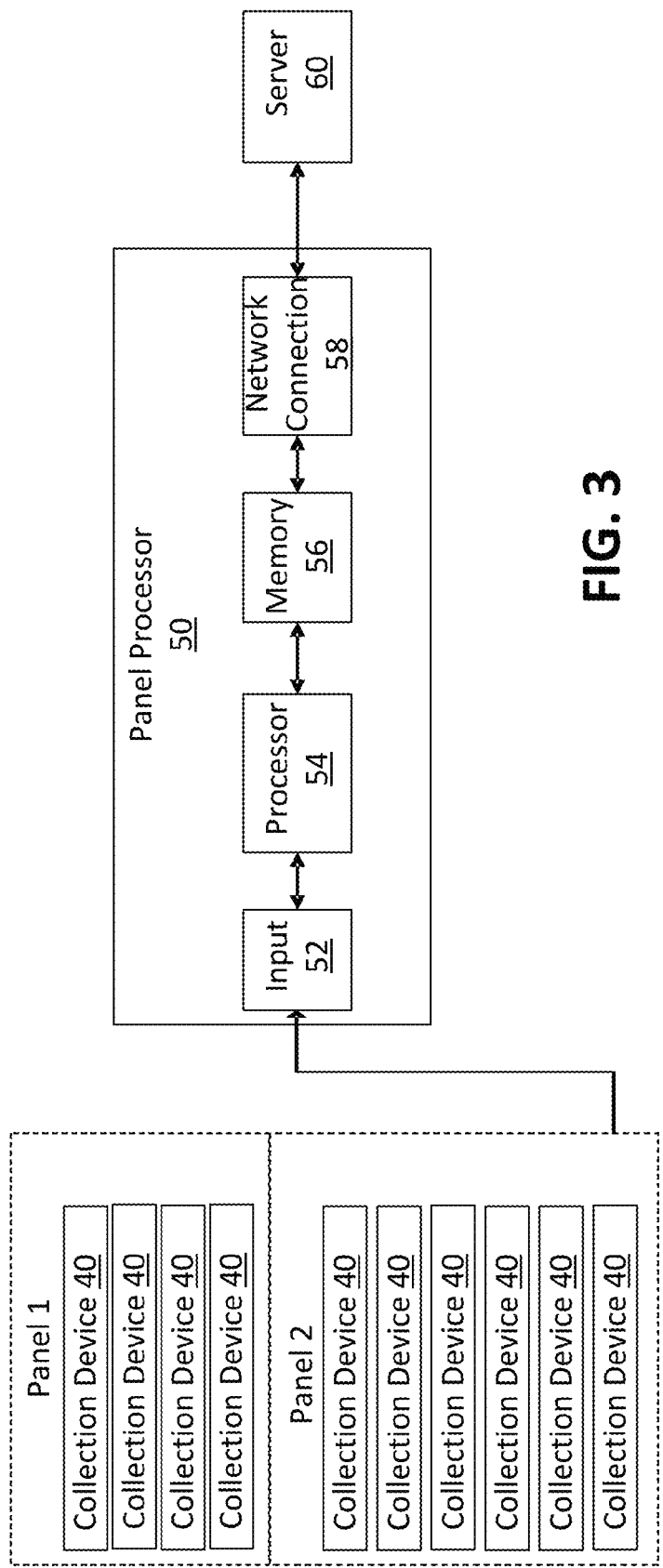
FIG. 3 shows example implementation of a panel processor coupled to a plurality of collection devices.

FIG. 3 shows an example implementation of a panel processor 50 coupled to a plurality of individual collection devices 40, such as the collection device 40 shown in FIG. 2. In one example, the panel processor 50 may comprise an input circuit 52, a processor 54, a data storage element such as a memory 56, and a network connection 58. The processor 54 is configured to perform current calculations by executing instructions stored in the memory 56. The memory 56 may also store any needed constant values for current calculations. Once each current calculation is completed, the processor 54 may store the results in the memory 56 along with an address associated with the result, and a timestamp. The network connection 58 may then be used to send the current measurement(s), the address(es), and a timestamp(s) to a server 60 at regular intervals, irregular intervals, or based on a command from the server 60. Furthermore, the panel processor 50 may receive configuration data from the user via the server 60.

A branch circuit monitoring server 60 is coupled with each panel processor within a data center. Since there may be hundreds of panels in a data center, there may in turn be hundreds of panel processors obtaining and recording data from thousands of branch circuits. The server 60 is connected with a database (see, e.g., FIG. 1) and is configured to request data from the processors 54 of the panel processors 50 and store the collected data in the database (or other form of data storage). Like the processor 54, the database may include the branch ID, the current value and the time stamp. Once the data is collected from the processors 54 of the panel processors 50, the memory 56 at the panel processors 50 may be cleared thereby allowing the memory size at the panel processors 50 to be relatively small. Similarly, the collection device may have only sufficient memory to store only the most recent measurements or some number of measurements that would occur between polling cycles of the panel processor to the collection device.

The server 60, panel processors 50 and collection devices 40 are arranged in a programmable modular system. Thus, the system may be deployed in any data center with any number of branch circuits; the system easily adapts to the addition or removal of circuits, and does not require extensive customization for deployment. Moreover, the server 60 and panel processors 50 may be configured for self-discovery of new collection devices, circuits, etc., so that user programming or configuration of the system is minimized or even eliminated. A building management system may be configured to receive and display the measured parameters. In one example, the building management system is connected to the server by way of a Modbus® TCP connection, although other forms of standard or proprietary communications protocols are possible.

Besides the ability to view the data, the system also provides the data center or the purchasers of a circuit to manage the circuit usage. In one example, the data center may utilize the full capacity of a given circuit or set of circuits before installing additional panels and circuits. If, for example, a 20 amp circuit is a supplying at most 10 amps, then there are approximately 8 amps of underutilized capacity on that circuit (considering that it is typical practice to not fully load the circuit in order to avoid tripping the breaker). Across several panels there may additional underutilized capacity. Thus, the circuits may be rearranged or additional equipment coupled with the circuit rather than adding additional panels. Similarly, if a circuit is running over its maximum rated capacity, say consistently at or near 20 amps, then some load can be removed from the circuit and thereby avoid down time for the equipment coupled with the circuit when the breaker trips. The BMS module within the BMS system may be further configured to automatically notify the user when such conditions occur.

In this implementation, the panel processor 50 is connected with and configured to collect data, such as via polling or interrupt, from the collection devices 40 (e.g., a plurality of individual current measurement boards). In one specific implementation, for example, each of the collection devices 40 is connected with the panel processor 50 by way of a twisted pair parallel connection, although other forms of communication and connection are possible, such as I2C, SPI, or USB. As discussed above, the panel processor 50 includes an input 52 for receiving the data from the collection devices 40, a processor 54, and a storage device, such as some form of memory 56, where the data is stored at the panel processor 50. In one example, the processor 54 stores an indication of the branch where a particular measurement was taken (e.g., a branch ID), the measured current, and a time stamp.

In one implementation, each collection device is connected with or otherwise configured to receive input from eight current sensors. Depending on the implementation, however, any number of branch circuits may be connected with a collection device. In one implementation, the collection device is configured to poll each branch circuit monitor once per second or at some other interval or in response to a command, and may further be configured to store the measured current with association to the branch circuit where the measurement was taken as well as the time.

The panel processor 50 receives the measurements from each of the current sensors via the collection devices 40. Thus the panel processor 50 receives one or more DC voltage inputs from each collection device 40. In this implementation, the panel processor 50 is adapted to receive a very large number of signals as the system is expanded to cover more and more branch circuits. For example, the panel processor 50 may have one input for every current sensor. To handle these inputs, the panel processor 50 may employ an input circuit 52 comprising multiplexers and logic circuitry as needed. Furthermore, additional panel processors 50 may be added once a panel processor 50 has run out of inputs.

Once receiving the current measurements, the panel processor 50 may then convert the voltage measurements into current readings constantly, according to a schedule, or according to a user command. Using the example provided above, the panel processor 50 may constantly receive a 0 to 5 VDC signal representing a voltage drop across a resistor. The panel processor 50 may then solve for the branch current by determining the resistor current (using Ohm's law and accounting for any gain produced by the output circuit) and compensating for the turns ratio of the CT.

Figure 4:
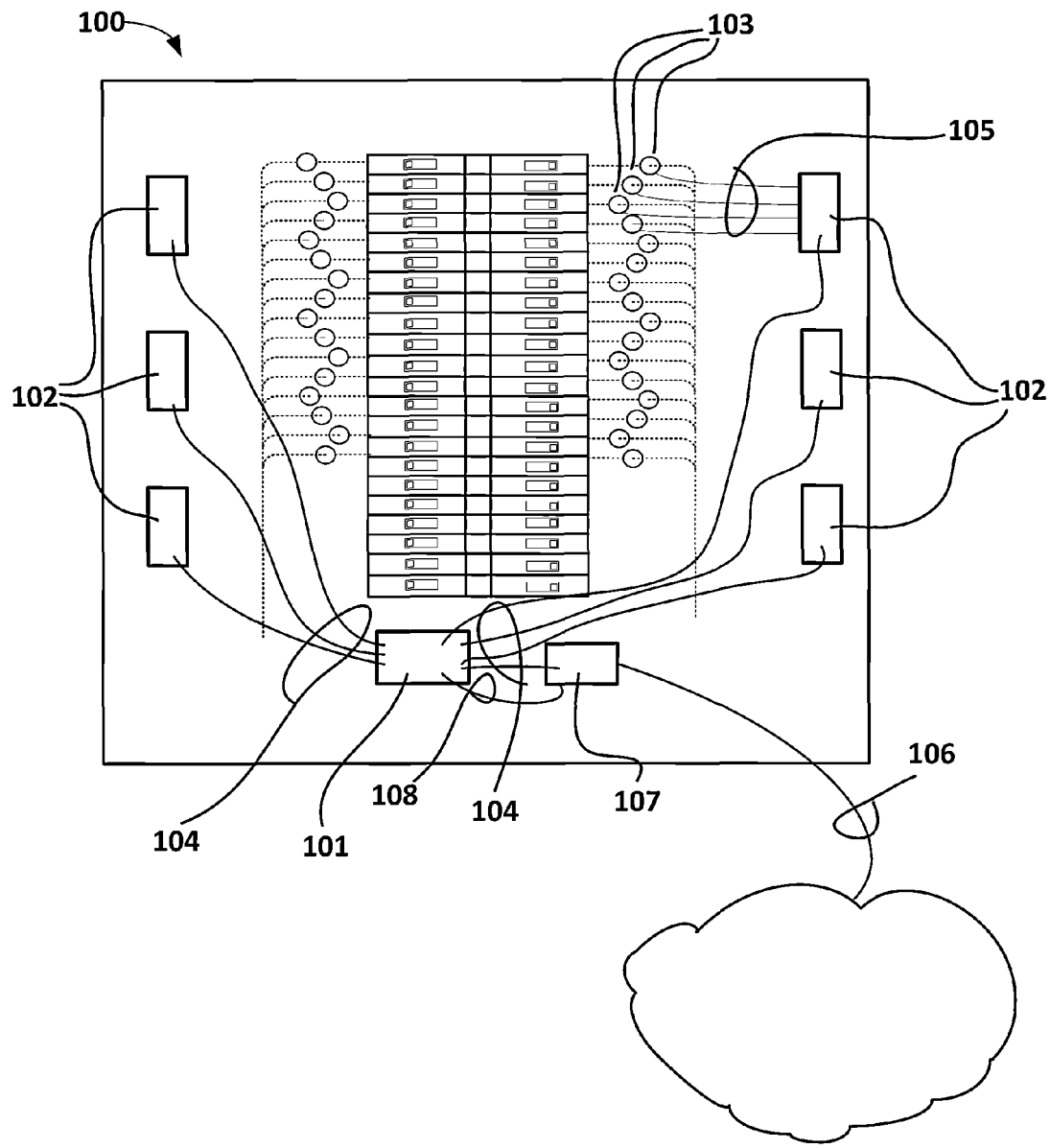
FIG. 4 is a view of an example BCM device installed in a circuit panel board.

One particular implementation of a BCM device 100 is illustrated in FIG. 4. In this particular implementation, the BCM device 100 comprises a panel processor 101, one or more collection devices 102 (e.g., current measurement or collection circuit boards), and one or more current sensors 103 (e.g., current transformers (CTs)) per collection device. The panel processor 101 may comprise any known processor, such as a general purpose processor, a special purpose processor, an ASIC, a digital signal processor (DSP) or the like. In the particular implementation of FIG. 3, for example, the panel processor comprises an ARM Cortex-8 processor using a Linux operating system with an easily modifiable programming language to ensure upgrades, patches, and additional features are as simple as upgrading a standard PC computer. In an alternate implementation, other processors and operating systems such as an Intel Atom processor using Windows 8 RT can be used. In one implementation, the BCM device uses split-core CT current sensors on each circuit to allow for easy installation of "live" panels without the need to de-energize.

Implementations of the BCM device may also use solid core CTs, or other current sensors such as Hall Effect sensors, or Rogowski coils. In one particular implementation, the panel processor, collection boards, and current sensors are small modular devices that are adapted to be installed inside of the panel enclosure. In this implementation, the collection devices connect to the panel process by means of a multi-conductor cable, such as a category 5 (Cat 5) Ethernet cable 104 for a simple parallel transmission of control and sensor signals or ribbon cable for a serial connection of the collection devices in a daisy-chain fashion in an alternate embodiment. The current sensors connect to the collection devices by means of a simple twisted pair cable 105. The only external connection to the BCM device, in this implementation, is a power-over-Ethernet cable (PoE) 106 that interfaces to a commercial-off-the-shelf (COTS) PoE splitter 107. The PoE splitter 107 passes network communications to and from the panel processor Ethernet interface and the rest of the network, and also provides 5V DC power to the panel processor.

Figure 5A:
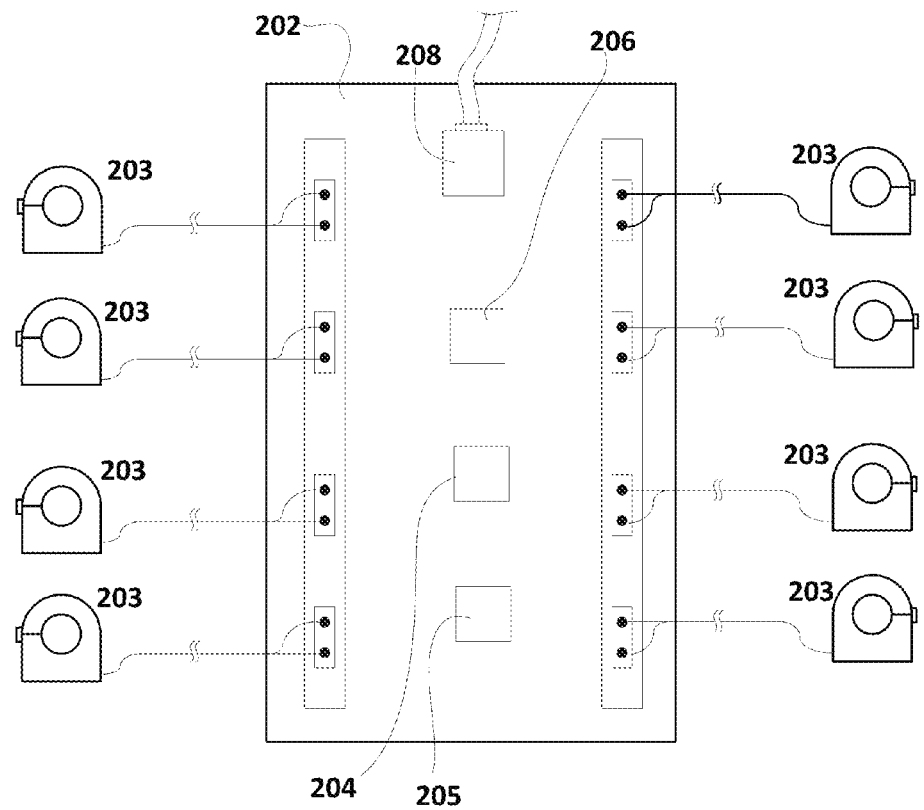
FIG. 5A shows an example collection device circuit board, also known as a CT interface (CTIF) board.
Figure 5B:
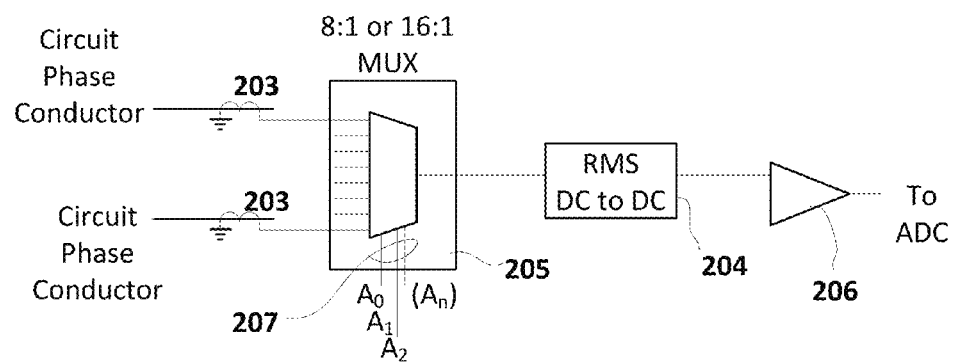
FIG. 5B shows a simplified schematic of an example analog processing chain on the CTIF board.

FIGS. 5A and 5B show physical and logical depictions of an example implementation of a collection device and its corresponding current sensors. In this particular implementation, for example, the current sensors comprise current transformer (CT) current sensors 203 and the collection device comprises a current transformer interface (CTIF) board 202. The CT current sensors 203 are coupled to each branch circuit and provide a signal indicative of the current flowing through the branch circuit to the CTIF board collection devices 202. In the case of the use of a CT current sensor 203, as shown in FIGS. 5A and 5B, the CT current sensor 203 may be both physically and inductively coupled to a component in the branch circuit, such as a power cable, a circuit breaker, or any other component that has the full or partial branch current. The CT current sensor 203 is also connected directly to the CTIF board collection device 202, providing the CTIF board collection device 202 with a signal that is indicative of the current flowing through the branch circuit. Thus, for example, if the servers being supplied by the branch circuit consume between a low of about 6 amps and a high of about 10 amps (e.g., during peak usage of the hosted website) at 120 VAC, then the CT current sensor 203 will produce a scaled AC voltage indicative of 6 to 10 amps (e.g., according to the turns ratio of the CT current sensor to the part the CT current sensor is coupled to).

In this implementation, the CT current sensors 203 generate an induced current proportional to the actual current passing through a branch circuit conductor that is installed through the air gap core of the CT current sensor 203. The CT current sensors 203, for example, may comprise a split-core or solid core device. A split-core CT current sensor 203, for example, allows the CT core to open and enclose the conductor without disconnecting or de-energizing the circuit. A solid core CT current sensor 203 may be used on a new installation before the circuits are energized. As shown in FIGS. 2A and 2B, a plurality of CT current sensors 203 (e.g., eight (8) in one implementation), connect to a collection device circuit board, also known as the CT interface (CTIF) board collection device 202. A plurality of CTIF boards collection devices 202 connect to the panel processor 101 (e.g., via Cat 5 cables or other methods) as previously described to give a total circuit capacity (e.g., a total capacity of at least 42 circuits in one implementation). One implementation supports six (6) CTIF board collection devices 202, although other implementations are possible. In one implementation, each CTIF board collection device 202 provides a signal termination resistor for each of the connected CT current sensors, converting the induced current that is proportional to the branch circuit current into a voltage by Ohm's Law. In other implementations, for example, a digital signal (e.g., digital word) representing the sampled current value may be generated. In still another implementation, a branch circuit current may be indirectly or directly coupled with a Hall Effect sensor to generate an AC or DC voltage proportional to the current in the conductor (as a function of time), or further converted to a DC signal through a rectifier or other signal conditioning circuit (e.g. integrator). Other implementations of providing a signal representative of a sampled current in a branch circuit may also be used.

These voltages (or other signal indicative of the current level sensed in a branch circuit) are then routed to a single RMS-to-DC converter integrated circuit 204 by means of a multiplexer integrated circuit 205 under the control of a panel processor, such as by way of address select lines 207. In one implementation, an 8:1 multiplexer and thus three (3) address select lines 207 are used, although other configurations are possible. Other implementations, for example, could use a 16:1 or 32:1 multiplexer for supporting more CT connections per CTIF 202. A benefit of using the RMS-to-DC converter circuitry 204 for the CT current sensors 203 is that the installation of the CT sensors 203 becomes non-critical since there is no longer a polarity associated with the current value, easing installation. In another embodiment, the RMS-to-DC converter 204 may be omitted for use with sensors other than CT sensors 203 that product a DC voltage as their output, such as a Hall Effect current sensor. The DC voltage produced by the RMS-to-DC converter circuitry 204 (or directly from the multiplexer 205 in the case of a DC current sensor implementation) is transmitted to an operational amplifier circuit 206 provides buffering and a low-impedance output for the CTIF board collection device 202 for transferring the DC voltage signal to the panel processor. In an alternate implementation, the operational amplifier circuit 206 could include non-inverting gain to increase the amplitude of the DC voltage. The DC voltage output of the operational amplifier 206 is connected to the signal output connector 208 of the CTIF board collection device 202. The output signal radiometrically corresponds to a specific branch circuit current, and the voltage is then sampled by the panel processor via an A/D converter and a periodic interval, nominally once per second (1 Hz), or at a rate supported by the hardware and the customer's needs. In one implementation, the panel processor has a built-in A/D converter that is multiplexed by the operating system to appear as individual A/D converter inputs (e.g., seven individual A/D converter inputs). Other implementations may employ external A/D converter devices, either multiplexed, or dedicated, per CTIF board collection device 202, or even per CT sensor 203. The A/D converter, or A/D converters, may be part of the CTIF board collection device 202, or be part of the panel processor. In an alternate implementation, the CTIF board collection device 202 has one or more A/D converters that transmit a CT digital word to the panel processor by a digital signal. In these implementations, the resulting digital signal value is then stored in a panel processor memory for later processing by software executing on the panel processor. The panel processor cycles through all the CTIF board collection devices 202 and attached CT sensors 203 connected to the CTIF board collection devices 202 to represent all the digital branch circuit current values and stores the digital branch circuit current values in the panel processor memory.

Figure 6:
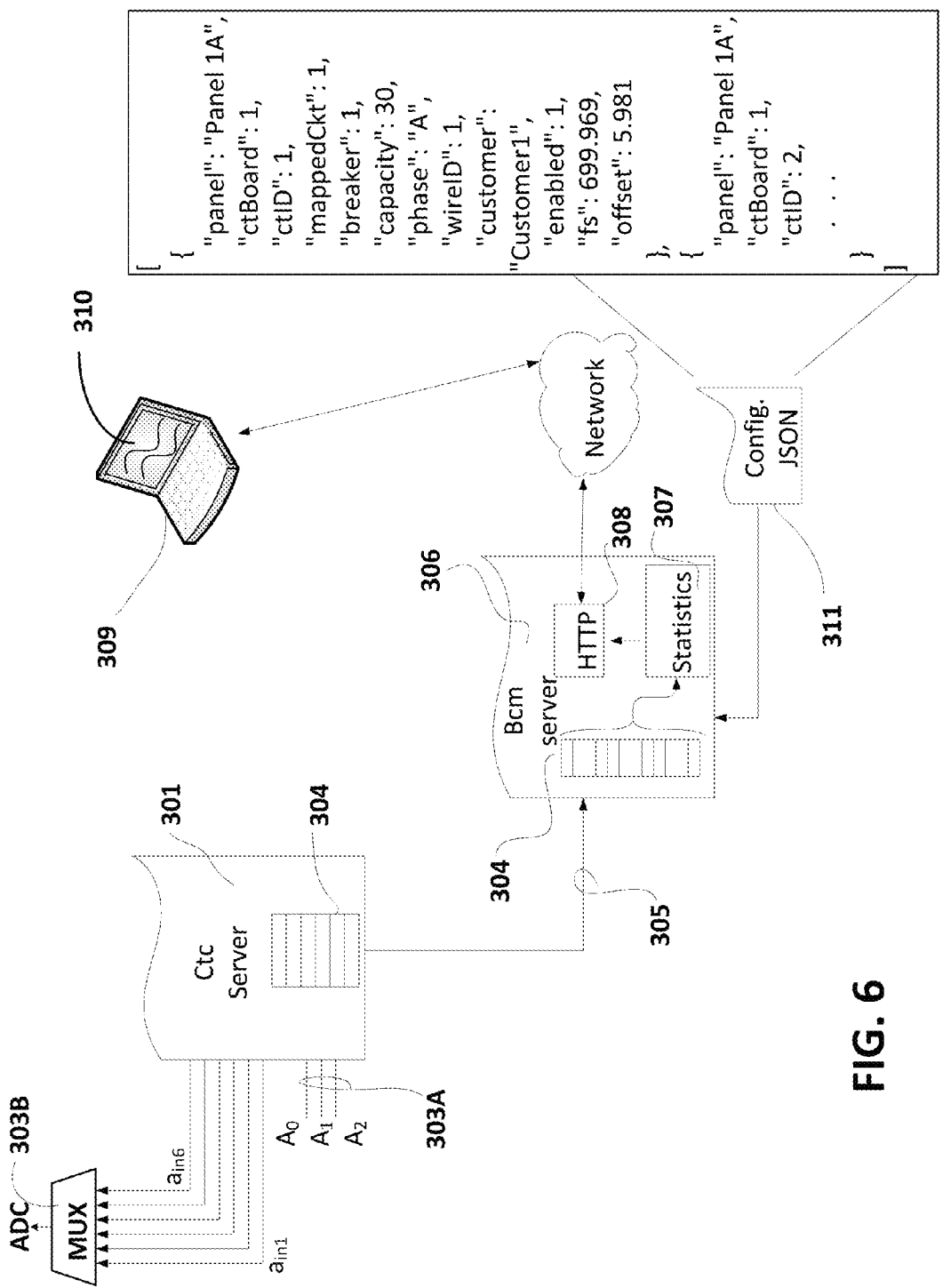
FIG. 6 shows the BCM device from software and networking perspectives.

FIG. 6 shows an example implementation of a system monitoring a branch circuit 300. A collection of digital values representing the branch circuit currents are interpreted by software executing on a panel processor as a current value, measured in Amperes RMS. In one implementation, for example, the panel processor executes two interdependent programs that retrieve, process, and communicate the branch circuit current values to the end user, or to another computer by means of a communications medium and protocol. In one embodiment, the programs are written in server-side JavaScript, known as node.js. Other programming languages such as, but not limited to, C, C++, or Python are possible in alternate implementations. As shown in FIG. 6, the first program, called the CT collection server (ctcServer) 301, interfaces with the panel processor digital input and output (I/O) signals 303A and A/D converter inputs 303B to set the digital bits of the address lines connected to the collection device's (e.g., a CTIF board collection device's) multiplexers, and sample the voltage output of the collection devices, respectively. The ctcServer program uses control structures to sequence and sample the DC voltage outputs presented by the collection devices, and store the converted digital value in a distinct memory location 304 for each value. Upon completion of the collection, conversion, and storage of all the DC voltage values representing all the branch circuit currents, then collates and transmits the digital values to the second program via a network socket protocol 305, although any type of communication such as a generic communication channel between a physical and/or logical layer may be used. The second program, called the branch circuit monitor server (bcmServer) 306, receives the values from the ctcServer 301, stores them in distinct memory locations 304, and computes short-term statistics 307 on the values for each circuit such as maximum, minimum, and average values, in addition to the current real-time value of the branch circuit current. It also provides for configuration of the panel processor via privileged access. In one implementation, the first and second programs execute on the same panel processor. In an alternate implementation, the two programs execute on separate processors connected by a networking media and protocol, or by other physical and/or logical means.

The bcmServer 306 also instantiates and executes an embedded hypertext transfer protocol (HTTP) server 308 to provide one or more networked users 309 with one of several visualizations of the branch circuit current data 310. The HTTP server of the bcmServer 306 can communicate with any number and type of HTTP clients such as, but not limited to, Internet Explorer, Firefox, or Google Chrome. The bcmServer 306 supports alarm threshold that activate if a branch circuit current exceed a set value, or values, on an instantaneous, or time-averaged basis. The bcmServer 306 will forward such alarm conditions to a central computer, or may display them on the embedded web server, or both. The bcmServer 306 web server allows privileged users to configure elements of the BCM such as client/customer name associated with a circuit, change circuit breaker amperage ratings, set, modify, and clear alarms, and perform built-in tests (BIT). The bcmServer 306 utilizes a configuration file 311, such as in a JavaScript Object Notation (JSON) format, to store the parameters of each branch circuit such as customer name, circuit number, breaker capacity, CT number, etc. The configuration file can be modified through the privileged access or offline and uploaded to the panel processor. Alternate formats for the configuration file such as, but not limited to, extensible markup language (XML) or comma separated values (CSV) are possible in alternative embodiments.

Figure 7:
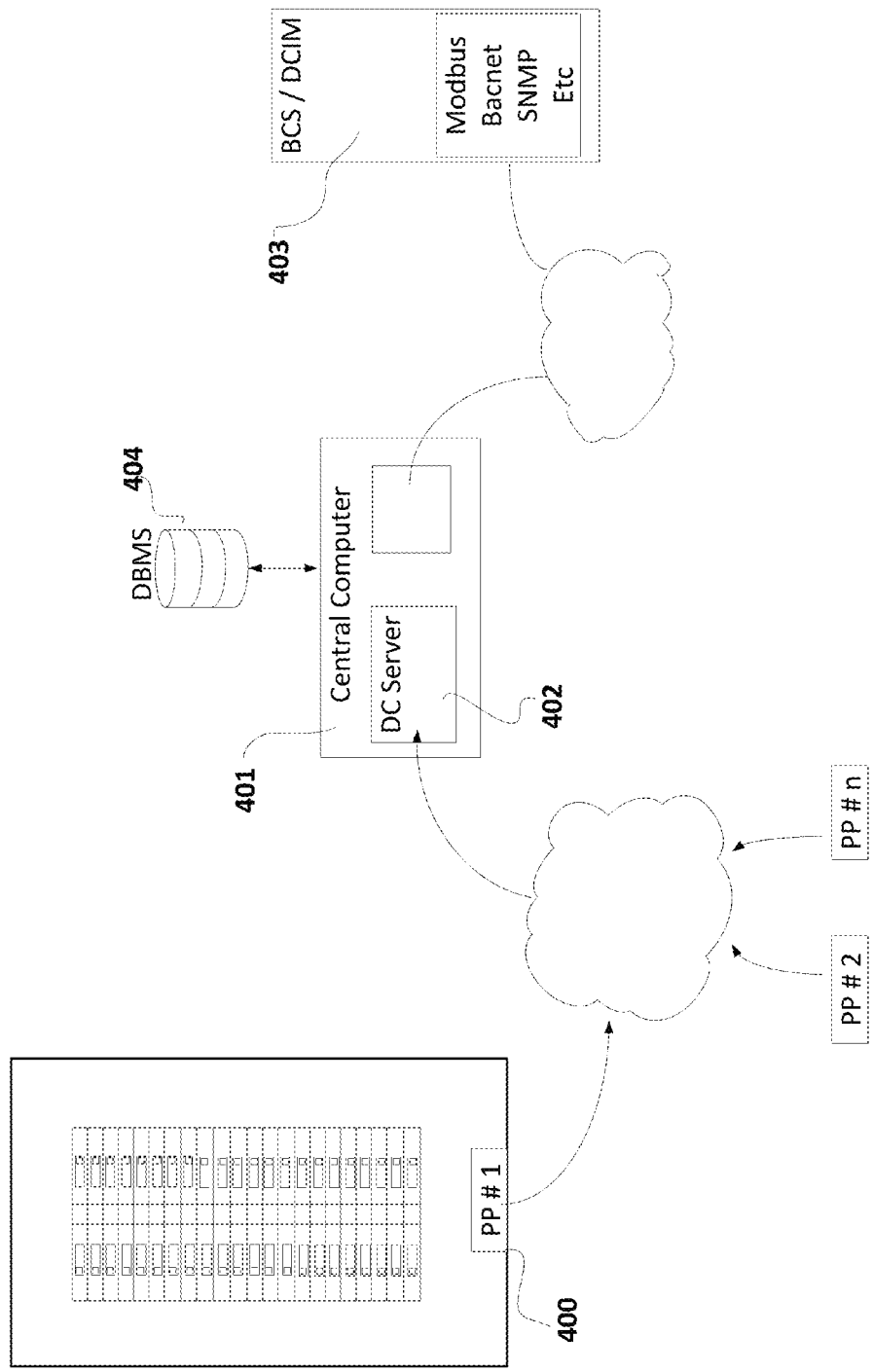
FIG. 7 shows the BCM System (BCMS) block diagram.

As shown in FIG. 7, in one implementation, the BCM devices' one or more panel processor 400 communicate to a central computer 401 executing software called the data center server (dcServer) 402. The central computer 401, dcServer program 402, and two or more BCM devices comprise a BCM System (BCMS). The BCMS allows centralized access, data storage, querying, retrieval, and visualization of all the circuits in the data center. Additionally, through the central computer 401 and the dcServer program 402, the BCMS can communicate with third-party data center information management (DCIM) or building management system (BMS) software 403 via standard or proprietary protocols as desired by the customer. Additionally, the central computer 401 and dcServer software 402 may send alarm, status, or diagnostic messages to networked users by means SMS texts, email, or voice communications.

One useful feature of the BCMS is the storage, querying, and retrieval of historical branch circuit's current data. The central computer 401 hosts a database management system (DBMS) 404 that stores and retrieves historical branch circuit current data. The DBMS 404 allows short-, medium-, and long-range data storage for each branch circuit. The panel processors 101 will send a running-average value of each branch circuit at a rate of once per minute (1/60 Hz) to the central computer that stores each branch circuit value in the DBMS 404. In one implementation, the DBMS 404 will store these values in a circular buffer such that the last 24 hours of 1/60 Hz data for each branch circuit current is available for viewing or analysis. Similarly, the DBMS 404 will calculate and store running averages for the branch circuit currents at rates of once per quarter hour, hour, six hours, and daily in a similar circular buffer of length commensurate with the sampling rate. Users can query, view, and analyze branch circuit current data in graphical format to look for trends or trouble conditions over a plurality of time and date ranges.

Figure 8:
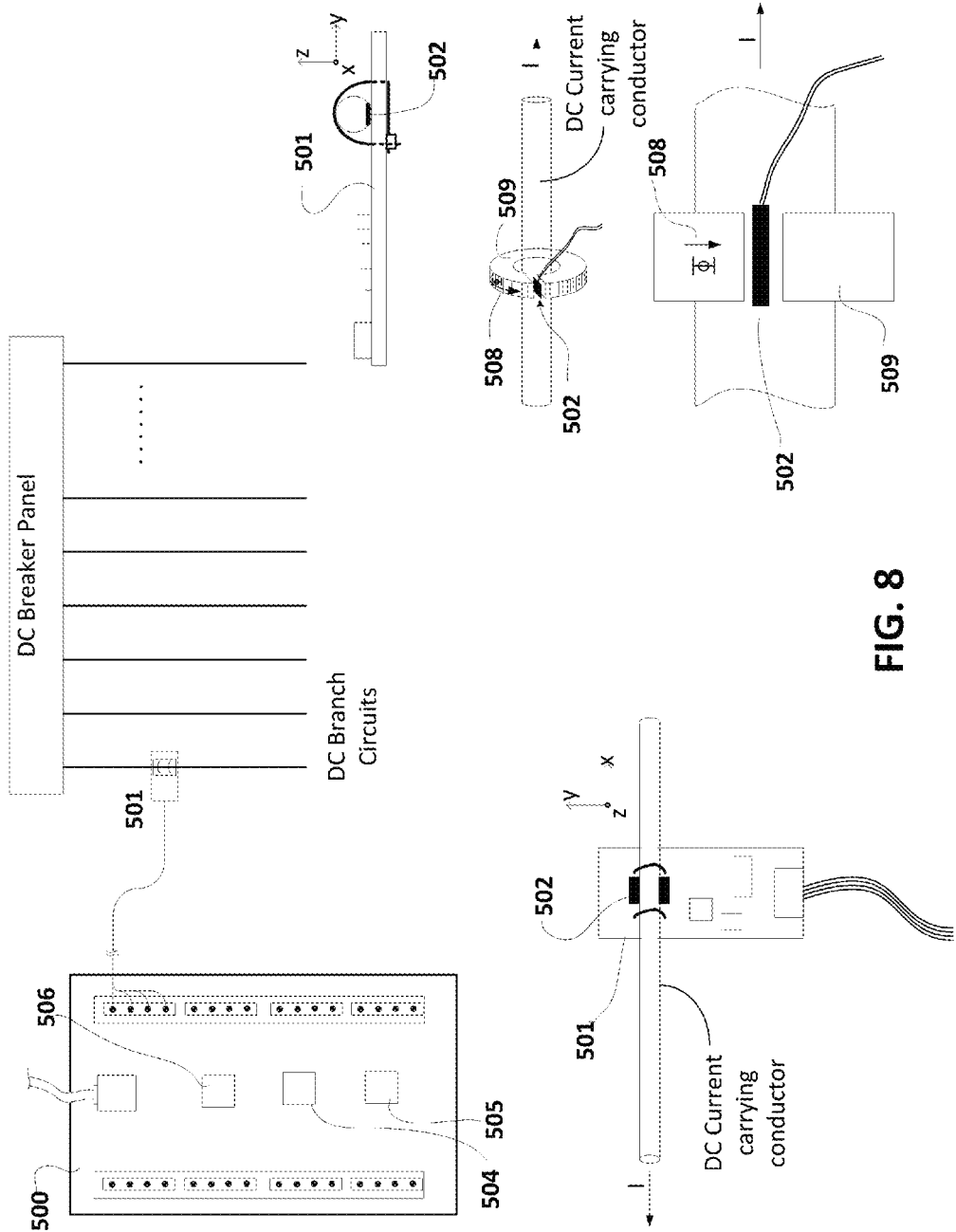
FIG. 8 shows the alternate embodiment of the CTIF board with Hall Effect sensors.

As shown in FIG. 8, in an alternate embodiment, a BCMS supports branch circuit current monitoring of DC currents. In this embodiment, the current sensors comprise non-contact current sensors 501, such as using Hall Effect sensor devices 502 to produce a DC voltage that is proportional to the DC or AC current flowing through a branch circuit conductor. In one implementation for measuring only DC currents, for example, the collection devices will bypass or omit the RMS-to-DC converter circuitry 504 and directly connect the Hall Effect sensor voltage through a multiplexer 505 to an operational amplifier circuit 506. In one embodiment of the Hall Effect sensor 501, the branch circuit conductor is arranged parallel to the major plane of the Hall Effect sensor and the current is inferred by means of the Hall Effect. Melexis produces Hall Effect current sensor integrated circuits that support such an arrangement. In an alternate embodiment of the Hall Effect sensor, the branch circuit current induces a magnetic flux 508 in a permeable core 509 similar to that of a conventional CT, with the Hall Effect sensor's main plane perpendicular to the flux flow. Several manufacturers produce Hall Effect sensors that support this arrangement. The software would be minimally changed to reflect a DC current versus an AC current.

As an alternate to the analog signal produced by the Hall Effect sensor, a variation of the aforementioned Hall Effect sensors outputs a digital signal, such as a pulse width modulation (PWM) waveform. This method provides increased accuracy and immunity to noise as compared to an analog output. In place of an A/D converter, the panel processor starts a counter when the waveform transitions from low to high logic levels, and stops the counter when the waveform transitions from high to low logic levels. The counter value is compared to a value of the counter for a high to high logic level interval, indicating a radiometric representation of the current value.

In lieu of one or more current sensors connected to a collection device, one or more voltage sensors may be connected. A voltage sensor connects between a phase voltage line and the neutral line of a polyphase system, typically two or three phases. The voltage sensor translates the line-to-neutral voltage down from a high voltage, typically 120V RMS to a lower voltage, typically less than 5V RMS. The voltage sensor output then connects to the collection device in a similar fashion as a current sensor. The voltage is applied across the sensing resistor in the same manner as the current sensor, and multiplexed and converted to a DC voltage via the RMS-to-DC converter integrated circuit, or a rectification circuit. The DC voltage is either transmitted to the panel processor and converted to a digital value by means of the panel processor A/D converter, or directly converted by means of an A/D converter resident on the collection device, and transmitted to the panel processor as a digital signal to a digital input port on the panel processor.

The resulting digital values of the phase voltages are interpreted by the software on the panel processor to represent Volts RMS. The phase voltages are associated to one or more branch circuits by a defined pattern. Thus, for each branch circuit, a current sensor can determine the branch circuit current measured in Amperes RMS, and the phase voltage is determined by a voltage sensor voltage measured in Volts RMS. From these two values, the apparent power can be accurately calculated measured in Volt-Amps (VA). The apparent power describes the accurate power drawn by the branch circuit. In addition, energy usage by the branch circuit can be calculated by integrating apparent power over a time interval. The resulting energy value is measured in Volt-Amp-hours (VA-h). This energy value can be used in subsequent calculations to estimate cooling requirements of a data center based on energy usage of equipment connected to branch circuits.

Figure 9A:
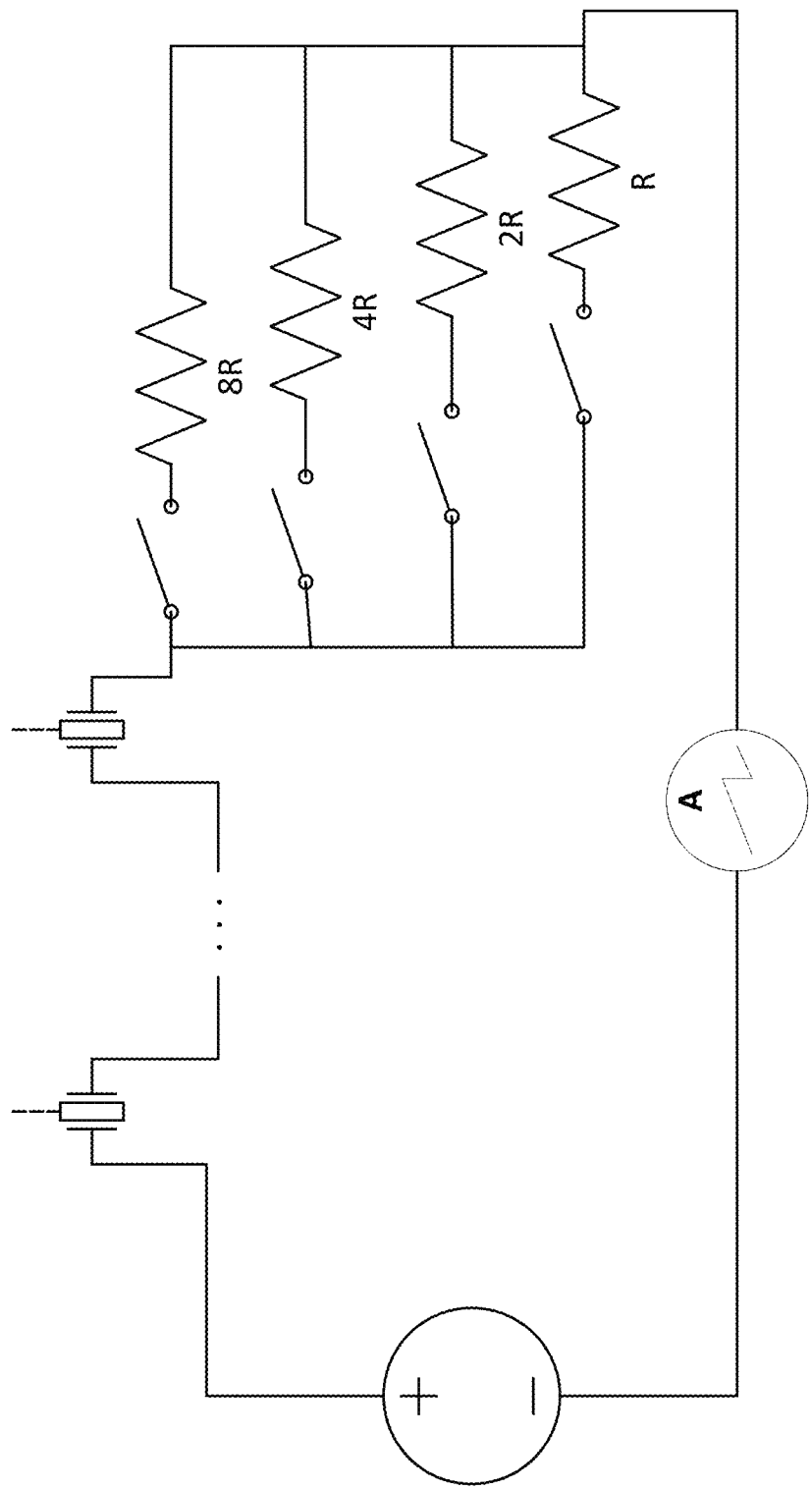
FIG. 9A depicts a calibration setup.
Figure 9B:
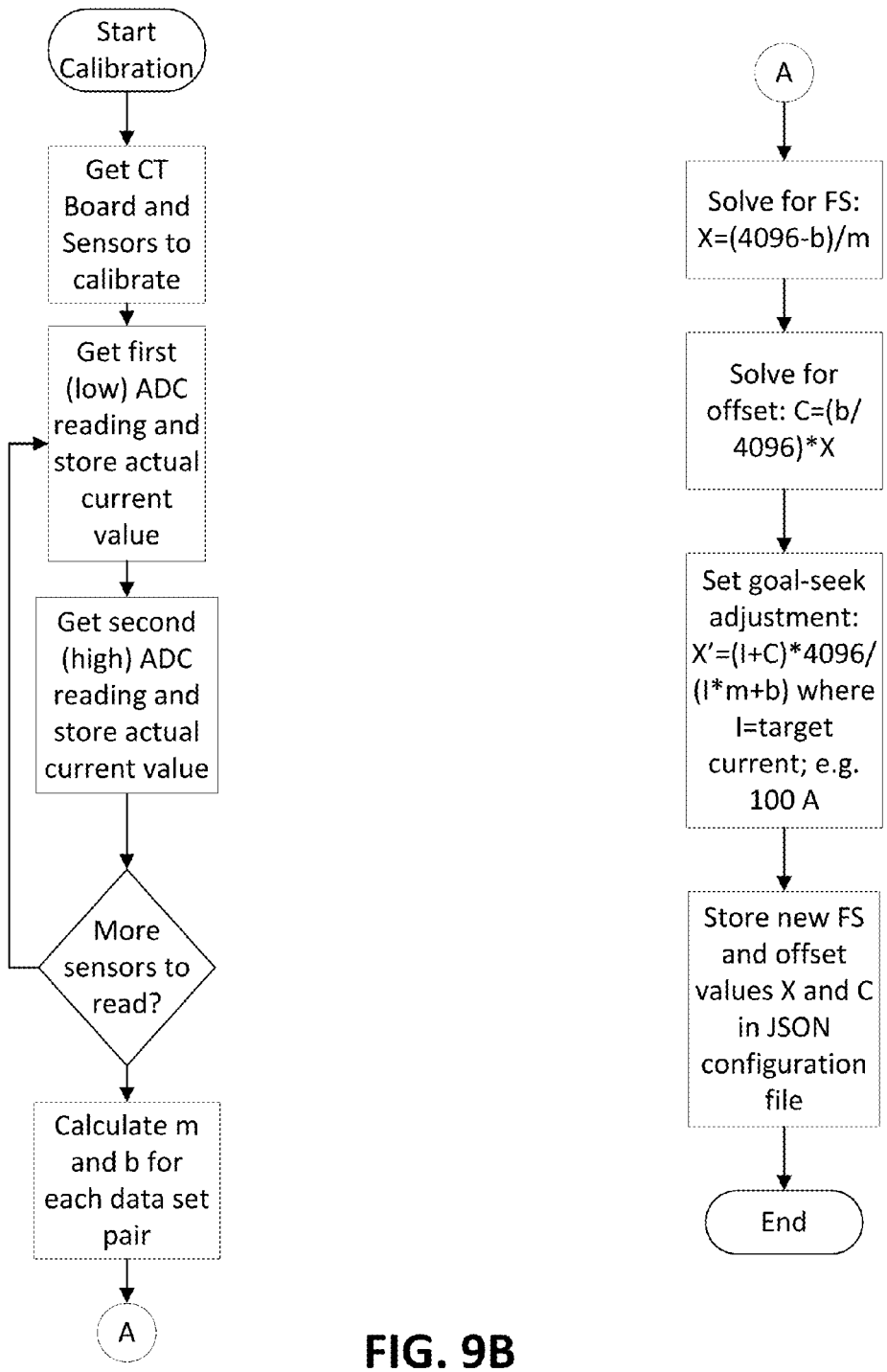
FIG. 9B gives an example algorithm flowchart to accomplish the calibration for a sensor.

The aforementioned Hall Effect sensors 501 may be calibrated to provide highly accurate readings. FIG. 9A depicts an example calibration setup. The method to calibrate one or more sensors involves using a goal-seek algorithm and a test setup to provide a known value of current through the representative conductor that the sensor will be associated with by means of a calibration station. The response parameters of the DC sensor are an offset value and a full-scale reading value, both defined in Amperes. These two values are unique to each sensor and stored in the JSON configuration file 311 as described above. FIG. 9B gives an algorithm flowchart to accomplish the calibration for a sensor. The algorithm may be extended to allow calibration of any number of sensors that are connected to the calibration station. Once the calibration is complete, the new offset and full-scale values for each sensor are stored it the configuration file for use in an operational system. If a sensor is replaced, or the conductor that it is measuring is changed, the calibration needs to be repeated with the new sensor and/or the new conductor.

Although embodiments of this invention have been described above with a certain degree of particularity, those skilled in the art could make numerous alterations to the disclosed embodiments without departing from the spirit or scope of this invention. All directional references (e.g., upper, lower, upward, downward, left, right, leftward, rightward, top, bottom, above, below, vertical, horizontal, clockwise, and counterclockwise) are only used for identification purposes to aid the reader's understanding of the present invention, and do not create limitations, particularly as to the position, orientation, or use of the invention. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other. It is intended that all matter contained in the above description or shown in the accompanying drawings shall be interpreted as illustrative only and not limiting. Changes in detail or structure may be made without departing from the spirit of the invention as defined in the appended claims.

What is claimed is:

1. A branch circuit monitoring system comprising:
   a first collection device configured to receive alternating current (AC) signals indicative of a measured current value in at least one branch circuit of a first plurality of branch circuits and convert the alternating current (AC) signals indicative of the measured current value in the at least one branch circuit of the first plurality of branch circuits from the alternating current (AC) signal to a direct current (DC) signal indicative of the measured current value;
   a second collection device configured to receive alternating current (AC) signals indicative of a measured current value in at least one branch circuit of a second plurality of branch circuits and convert the alternating current (AC) signals indicative of the measured current value in the at least one branch circuit of the second plurality of branch circuits from the alternating current (AC) signal to a direct current (DC) signal indicative of the measured current value; and
   a panel processor in communication with the first and second collection devices configured to receive the plurality of DC signals via an input circuit of the panel processor, the input circuit comprising multiplexers for receiving the first plurality of DC signals from the first collection device and the second plurality of DC signals from the second collection device, the panel processor configured to store in a local memory a plurality of data structures comprising the measured branch circuit current data values for said branch circuit along with a timestamp associated with a time at which the currents were measured.

2. The branch circuit monitoring system of claim 1 further comprising a branch circuit monitor server and an associated database, the branch circuit monitor server in communication with the panel processor by means of a network or communication channel and configured to receive the plurality of data structures from the panel processor.

3. The branch circuit monitoring system of claim 1 further comprising:

a first plurality of current sensors configured to be coupled to the at least one branch circuit of the first plurality of branch circuits and to measure a current within one of the respective first plurality of branch circuits and to provide the signal indicative of the measured current value in the at least one branch circuit of the first plurality of branch circuits; and a second plurality of current sensors configured to be coupled to the at least one branch circuit of the second plurality of branch circuits and to measure a current within one of the respective second plurality of branch circuits and to provide the signal indicative of the measured current value in the at least one branch circuit of the second plurality of branch circuits.

4. The branch circuit monitoring system of claim 3 wherein the first and second plurality of current sensors each comprise a current transformer.

5. The branch circuit monitoring system of claim 3 wherein at least two of the first plurality of current sensors are each coupled with a sub-branch of a first branch circuit of the first plurality of branch circuits and configured to measure a current value within the sub-branches of the first branch circuit of the first plurality of branch circuits.

6. The branch circuit monitoring system of claim 5 wherein a measured current value of the first branch circuit is determined by summing the measured current values of each of the sub-branches.

7. The branch circuit monitoring system of claim 1 wherein the panel processor polls the first and second collection devices for the first and second DC signals.

8. The branch circuit monitoring system of claim 1 wherein the data structure comprises a branch identifier, a measured current and a time stamp.

9. The branch circuit monitoring system of claim 1 wherein the panel processor is configured to provide the data structure over a data connection to a building management system.

10. The branch monitoring system of claim 1 further comprising a building management system running on a server machine, the building management system including a branch circuit monitoring module configured to receive the branch circuit monitoring data over a data connection, the branch circuit monitoring module further configured to display the branch circuit monitoring data within the building management system.

11. The branch monitoring system of claim 1 wherein the signal indicative of the measured current comprises a voltage level.

12. The branch monitoring system of claim 1 wherein the signal indicative of the measured current comprises a digital value.

13. The branch monitoring system of claim 1 wherein each of the first and second collection devices comprises a rectifier/signal conditioning element, an analog to digital converter and an output connection to convert the signals indicative of the measured current value from each of the first and second plurality of current sensors to the first and second DC signals, respectively.

14. The branch circuit monitoring system of claim 13 wherein the rectifier/signal conditioning element comprises a resistor coupled to a voltage rectifier and is configured to convert an AC resistor voltage to an equivalent DC voltage.

15. The branch circuit monitoring system of claim 14 wherein the rectifier/signal conditioning element further comprises a signal conditioner configured to prepare a signal for use by an analog to digital converter.

16. The branch circuit monitoring system of claim 1 wherein the panel processor is configured for self-discovery of a new collection device.

17. A method of monitoring branch circuits comprising:
receiving, at a first collection device, a first plurality of alternating current (AC) signals indicative of a first plurality of measured current values of a first plurality of branch circuits;
converting, at the first collection device, the alternating current (AC) signals indicative of the measured current value of the first plurality of branch circuits from the first alternating current (AC) signal to a first direct current (DC) signal indicative of the measured current value;
receiving, at a second collection device, a second plurality of alternating current (AC) signals indicative of a second plurality of measured current values of a second plurality of branch circuits;
converting, at the second collection device, the alternating current (AC) signals indicative of the measured current value of the second plurality of branch circuits from the second alternating current (AC) signal to a second direct current (DC) signal indicative of the measured current value;
receiving, at a panel processor in communication with the first and second collection devices, the first and second plurality of DC signals via an input circuit of the panel processor, the input circuit comprising multiplexers for receiving the first plurality of DC signals from the first collection device and the second plurality of DC signals from the second collection device; and
storing, in a local memory of the panel processor, a plurality of data structures comprising the measured branch circuit current data values for said branch circuit along with a timestamp associated with a time at which the currents were measured.

18. The method of claim 17 further comprising measuring a first plurality of currents within the first plurality of branch circuits using a first plurality of current sensors each coupled with a respective branch of the first plurality of branch circuits.

19. The method of claim 18 wherein at least two of the first plurality of current sensors are each coupled with a sub-branch of a first branch circuit of the first plurality of branch circuits and configured to measure a current value within the sub-branches of the first branch circuit of the first plurality of branch circuits.

20. The method of claim 19 wherein a measured current value of the first branch circuit is determined by summing the measured current values of each of the sub-branches.

21. The method of claim 17 further comprising self-discovering, by the panel processor, a new collection device.

22. The method of claim 18 wherein the each of the first plurality of current sensors comprises a current transformer.

* * * * *